United States Patent [19]

Ishii et al.

[11] Patent Number: 4,475,259
[45] Date of Patent: Oct. 9, 1984

[54] ULTRASONIC CLEANING APPARATUS

[75] Inventors: Mineo Ishii, Fukuyama; Kasei Arimoto, Kasaoka; Teruyuki Nakano, Fukuyama, all of Japan

[73] Assignee: Ishii Hyoki Co., Ltd., Japan

[21] Appl. No.: 385,608

[22] Filed: Jun. 7, 1982

[30] Foreign Application Priority Data

Jun. 9, 1981 [JP] Japan ................................. 56-89094

[51] Int. Cl.$^3$ .............................................. B08B 3/12
[52] U.S. Cl. ......................................... 15/102; 15/77; 134/64 R; 134/122 R; 134/184
[58] Field of Search ........... 15/77, 102; 134/1, 122 R, 134/184, 64 R

[56] References Cited

U.S. PATENT DOCUMENTS

4,129,919 12/1978 Fitch ..................................... 15/102
4,294,533 10/1981 Bratt ..................................... 15/102

Primary Examiner—Edward L. Roberts
Attorney, Agent, or Firm—William A. Drucker

[57] ABSTRACT

The disclosure relates to a compact apparatus which effectively washes holes of printed circuit cards, flushes exfoliation off printed circuit cards and nameplates after etching, degreases and flushes number-plates before painting, and cleans iron, plastic, and glass plates, wherein a processing cistern is divided into a carry-in compartment (A), a cleaning compartment (B), a water-wash finishing compartment (C) and a drying compartment (D), the carry-in compartment (A) comprising an infeed roller, a pair of rubber rollers mounted vertically facing each other at a certain forward position thereof and a cleaning solution shut-out roller rotatable by the lower roller of the pair, the cleaning compartment (B) comprising a pair of rubber rollers vertically facing each other at a certain forward position of the pair of rubber rollers, a cleaning solution shut-out roller rotatable by the lower roller thereof, transfer rollers with conveying belts stretched therebetween so mounted that they may be rotated at the same level with or lower than the contact faces of and between the pairs of rubber rollers, and an ultrasonic vibrator installed at the bottom, and the water-finishing compartment (C) comprising vertically spaced water injectors opposite to each other and squeezing rollers in contact with each other.

3 Claims, 4 Drawing Figures

4,475,259

ULTRASONIC CLEANING APPARATUS

BACKGROUND OF THE INVENTION

Hitherto, cleaners employing ultrasonic vibrators have been well known, which are of a batch-process type wherein washing immersed in liquid in a processing cistern is exposed to ultrasonic waves generated by vibrators equipped on the inside walls and at the bottom of the cistern. This type of cleaner requires much time and trouble for putting in and removing of articles from a wash and further another rinsing step to finish the cleaning, thus necessitating much equipment and labor for these purposes.

OBJECTS OF THE INVENTION

An important object of the present invention is to improve said troublesome processes for higher labor efficiency by the employment of a conveying system which will permit continuous operations including the rinsing and drying steps. Another object of the present invention is to supply a market with a compact and inexpensive apparatus which can perform powerful cleaning by the use of ultrasonic waves and ultimately contribute to labor saving and high productivity.

These and other objects of the present invention will be made clearer by reference to the following descriptions and drawings attached hereto.

DESCRIPTION OF THE PREFERRED EMBODIMENT

Figure 1:
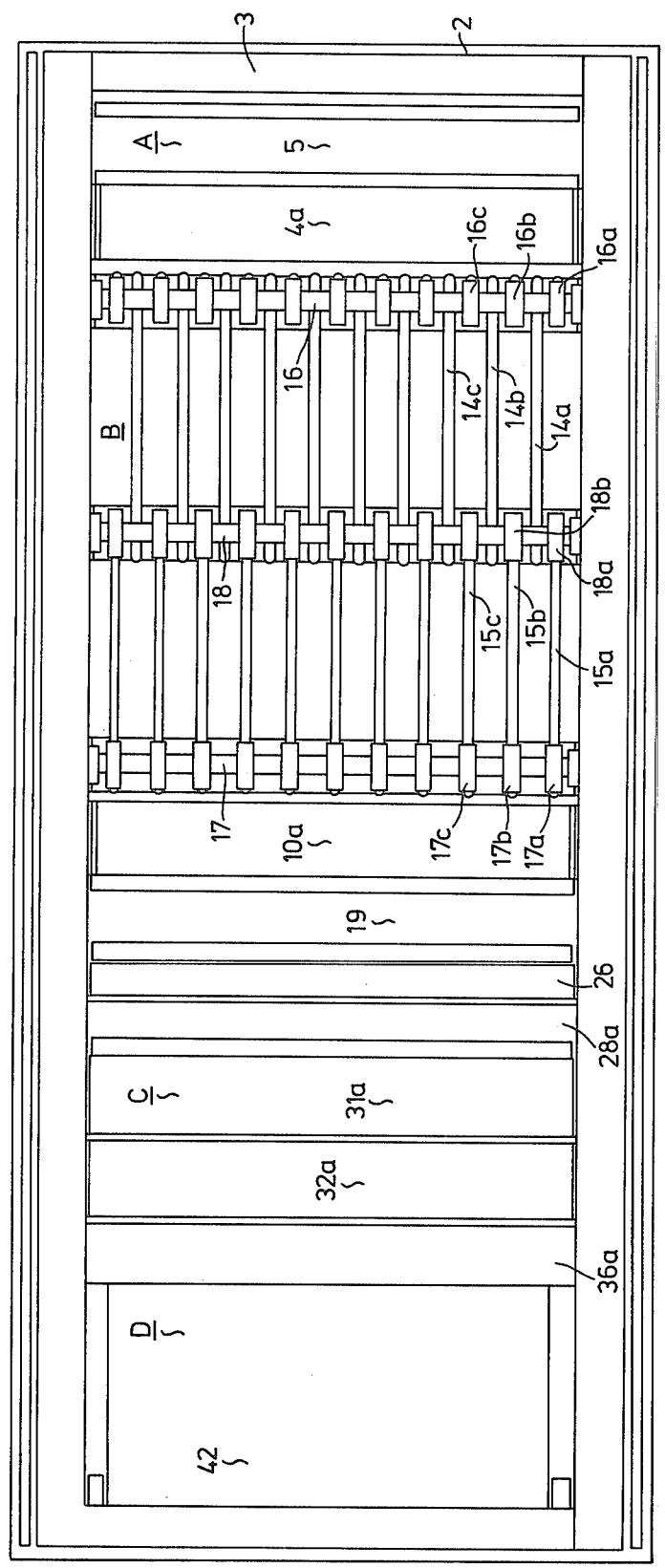
FIG. 1 is a view of an entire embodiment disclosed by the present invention.

In all the drawings numeral 1 designates the frame of an apparatus which contains a control, a blower, and a motor. Numeral 2 indicates a processing cistern placed horizontally on said frame 1, which is partitioned into a carry-in compartment A, a cleaning compartment B, a water-finishing compartment C, and a drying compartment D in sequence along the traveling direction of articles being cleaned. Said compartments are constructed as follows:

Said carry-in compartment A consists of an infeed roller 3, a pair of rubber rollers 4a and 4b mounted vertically facing each other at a certain distance forward of said roller 3, and a sealing roller 5, said rubber rollers 4a and 4b being rotated clockwise or counterclockwise i.e. in the direction of the arrow by means of a driving chain to be described later and said infeed roller 3 rotated toward the arrow thereon, wherein the contact faces P of said rubber rollers 4a and 4b serve as a combination of an inlet for articles to be cleaned and a sealing face of wash water and said sealing roller 5 is so mounted as to freely rotate in contact with said rubber roller 4b and at a slightly lower position than the axial center thereof, the contact faces E of said rollers also forming a sealing face for wash water. The contact face F of said roller 5 with a horizontal plate 6 on the inlet side of said processing cistern 2, (i.e., the peripheral face of said roller 5 elastically in pressure contact with the nose of a rubber-like tongue 7) also serves as a sealing face for wash water. Numerals 8 and 9 designate freely rotating guide rollers mounted in such a position that the top faces thereof are slightly higher than the top face of said sealing roller 5, the horizontal line h connecting said rollers 8 and 9 being at the same level with or slightly lower than the horizontal H passing between the contact faces of said rubber rollers 4a and 4b.

Said cleaning compartment B comprises a pair of rubber rollers 10a and 10b mounted vertically facing each other at a certain distance forward of said pair of rollers 4a and 4b, transferring rollers 11 and 12 being rotated in the direction of the arrow by a driving chain and a freely rotating intermediate roller 13 therebetween, both being placed between said two pairs of rubber rollers and having a number of evenly spaced grooves arranged alternately, in which conveying belts 14a, 14b, 14c... and 15a, 15b, 15c... are stretched by way of said intermediate roller 13. Reference numerals 16, 17, and 18 designate pressure roller shafts on which a number of rolls 16a, 16b, 16c..., 17a, 17b, 17c... and 18a, 18b, 18c... are fixed axially in such a way that they can move up and down for a given stroke on said rollers 11, 12, and 13.

Said rubber rollers 10a and 10b serve as an outlet for articles being cleaned from said cleaning compartment B as well as a cleaning solution sealing face for wash water just like said rubber rollers 4a and 4b. The outlet side of said lower roller 10b is in close contact with a sealing roller 19 freely rotating in a slightly lower position than the axial center thereof, the contact faces G of both roller 10b and 19 also forming a cleaning solution sealing face for wash water, just as seen in said sending-in compartment A.

The reverse face of said roller 19 is in pressure contact with a rubber-like tongue 22 attached to the nose of a horizontal plate 21 mounted at the same level with said plate 6 in said carry-in compartment A on the lower parting plate 20b fixed vertically at the cistern bottom, the contact faces K serving as cleaning solution sealing face of wash water. Numerals 24 and 25 designate freely rotating guide rollers placed in such a position that the top faces thereof are slightly higher than that of said sealing roller 19, and a delivery roller 26 is so mounted that the top face thereof is at the same level with those of said guide rollers 27a and 27b designating ultrasonic vibrators installed at the cistern bottom.

Said water-wash finishing compartment C comprises the upper partition plate 20a facing said lower partition plate 20b spaced from each other to such an extent that articles sent out by said delivery roller 26 can pass smoothly between said two plates, L-shaped conduits 28a and 28b attached to said partition plates 20a and 20b on the side opposite to said cleaning compartment B, through which water pipes 29a and 29b are arranged longitudinal thereto with a number of through holes 30 on the facing surfaces to provide jets of finishing water, and two pairs of squeezing rollers 31a, 31b, and 32a, 32b mounted ahead of said conduits, each pair of rollers facing each other.

Said drying compartment D is divided roughly into a preparatory drying means and a finish drying means, the former comprising air injectors 35a and 35b vertically opposite to each other from which a hot air blast comes out, hoods 36a and 36b permitting said hot blast to blow both against the upper and lower sides of articles delivered out of said squeezing rollers, and hot blast hoses 37a and 37b, the finish drying means consisting of a wire-meshed conveyor 38 circling through a definite distance by way of conveying rollers 39 and 40, an electric heater 41 housed in said wiremeshed conveyor 38, and a hood 42.

Figure 3:
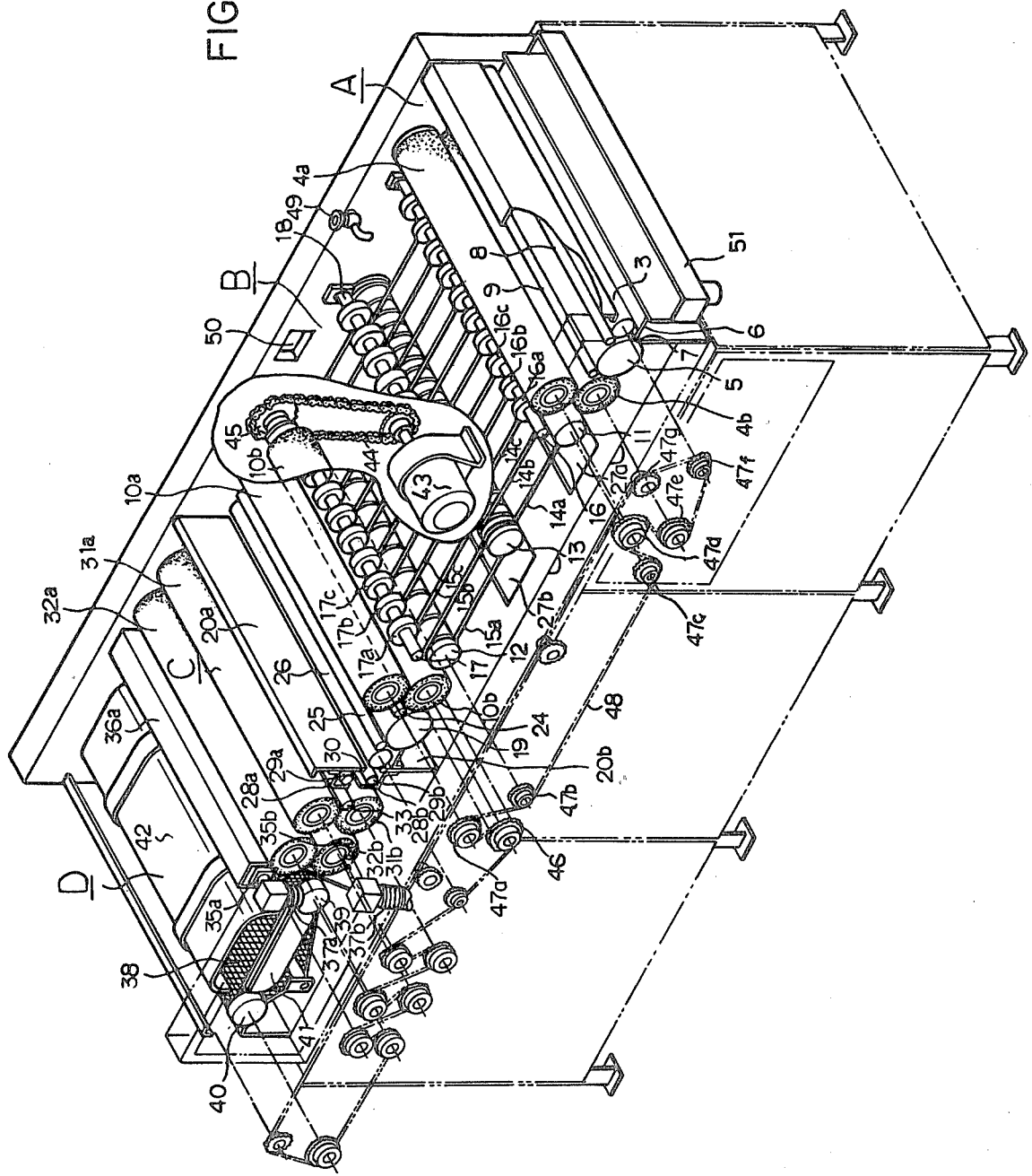
FIG. 3 is a perspective view broken away to show the interior of the embodiment of FIG. 1.

Said rollers in all compartments, such as infeed roller 3, rubber rollers 4a, 4b, 10a, and 10b, transferring rollers 11 and 12, delivery roller 26, squeezing rollers 31a, 31b, and 32a, 32b, and conveying rollers 39 and 40 are driven by the rotation of sprockets 47a, 47b, 47c ... fixed on said roller shafts and connected with each other by a chain 48 which is achieved by a drive sprocket 46 at the front of the apparatus rotated by a sprocket coaxial therewith and integral with one end at the back of the apparatus of the shaft of said rubber roller 10b, said sprocket 45 being driven via a chain 44 by means of a motor 43 contained in the frame 1 of the apparatus. (See FIG. 3.)

Figure 2:
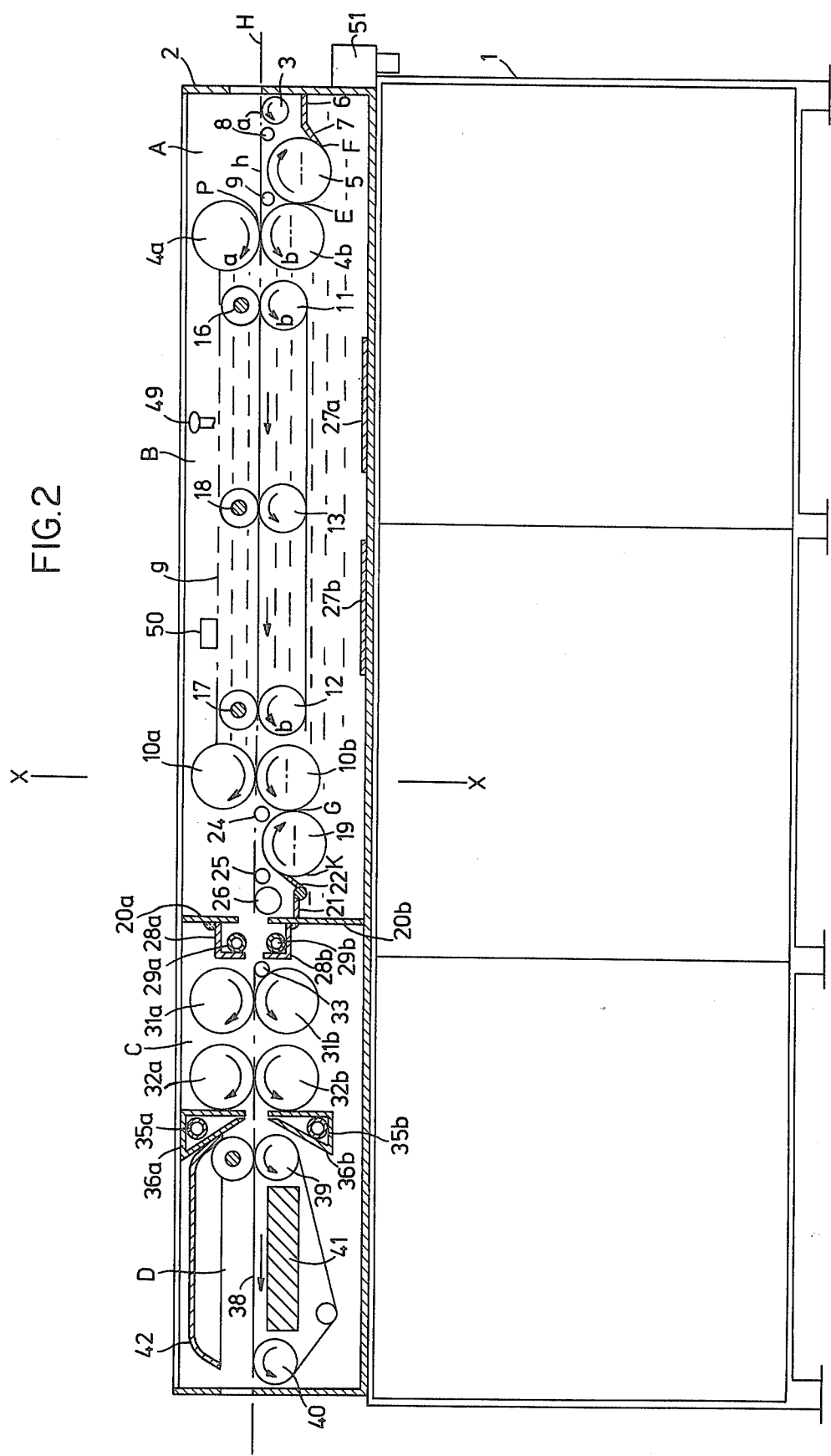
FIG. 2 is a vertical sectional elevation of FIG. 1.
Figure 4:
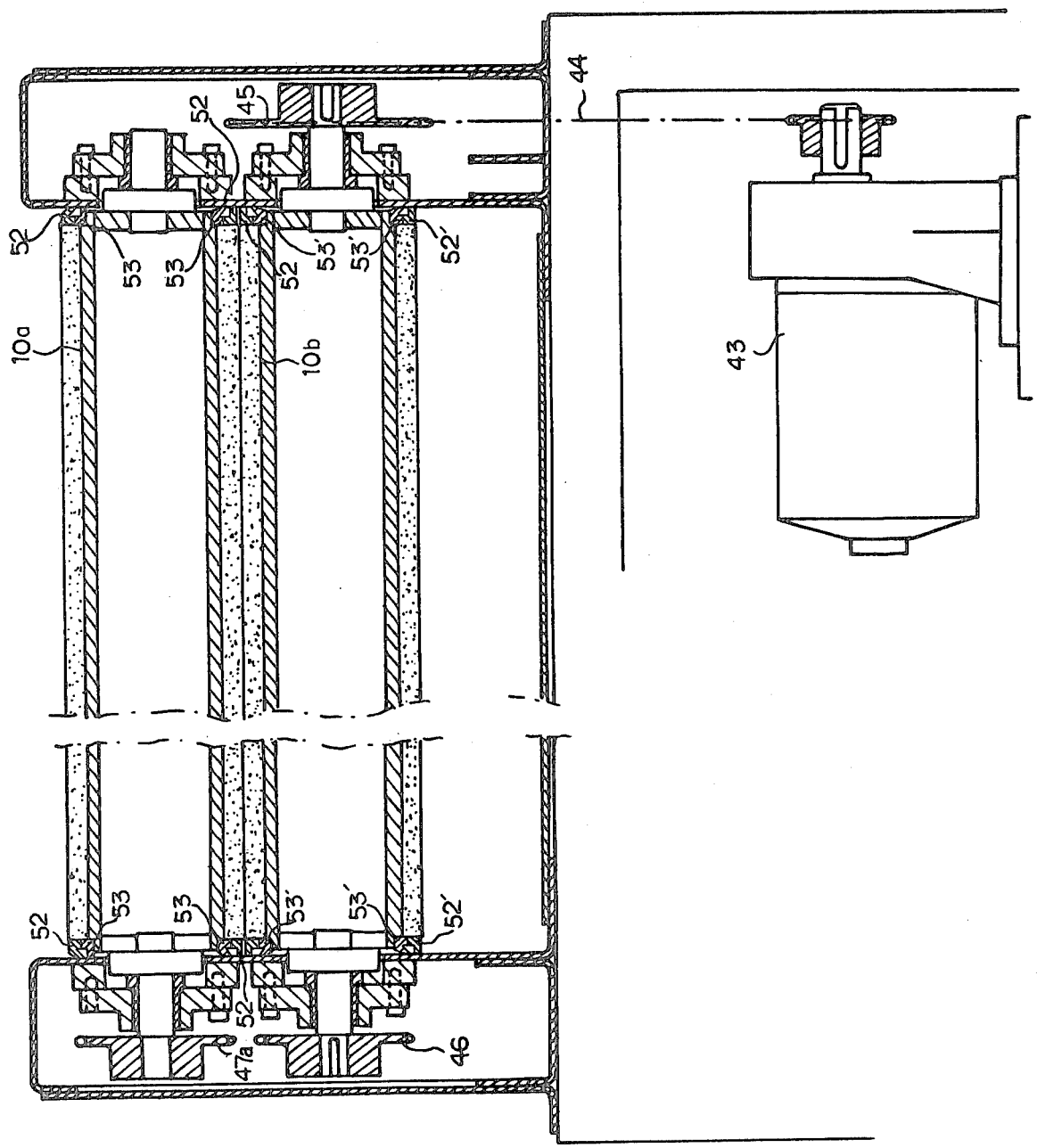
FIG. 4 is a sectional detail view along the line X—X of FIG. 2.

In the preferred embodiment disclosed by the present invention, water always flows in through a cock 49 on the back wall thereof so that water in said cleaning compartment B can be kept constantly at a certain level g (high enough to immerse washing of articles therein) (See FIG. 2.) water over said level g flows out of a weir 50, and wash water leaking just when the articles pass between said rubber rollers is discharged through a receiving conduit 51 at the front of the embodiment. As illustrated in FIG. 4, sealing packings 52, 52', and 53, 53' fitted on both ends of said rubber rollers 10a are in contact with the wall surfaces of said compartment B, which is also seen with said rubber rollers 4a and 4b and sealing rollers 19 and 5.

As described hitherto, the preferred embodiment disclosed by the present invention is of such construction that when in service wash water flows into said cleaning compartment to the level g, said ultrasonic vibrator 27a therein is operated to generate ultrasonic vibrations, and said motor 43 drives rollers such as said infeed roller 3 and rubber rollers 4a and 4b, water and hot air blast being injected through said water injectors 29a and 29b and said air jet pipes 35a and 35b respectively and heating being effected by said electric heater 41. Hence, articles being cleaned are first caught between the contact faces of said rollers 4a and 4b from said infeed roller 3 and sent into said cleaning compartment B where they are exposed to ultrasonic vibrations generated by said ultrasonic vibrators 27a and 27b to be cleaned of dirt during traveling on said conveying belts 14a, 14b, 14c ... and 15a, 15b, 15c ....

Articles after cleaning pass between said rubber rollers 10a and 10b up to said water-finishing compartment C, wherein they are finished with water blown against the upper and lower sides from said water injectors 29a and 29b, then dehydrated while traveling through said squeezing rollers 31a, 31b, 32a, and 32b.

Finally, the articles are sent into said drying compartment D, wherein they are exposed to a hot air blast blown against the upper and lower sides to evaporate water, and then thoroughly dried at the dry atmospheric temperature in the space formed between said hood 42 and said wire-meshed conveyor 38 while shifting thereon, and after that taken out of the cistern.

The embodiment described hitherto has an intermediate roller 13 fitted between said transferring rollers 11 and 12 so that two series of conveying belts 14a, 14b, 14c ... and 15a, 15b, 15c ... may be provided. The present invention can also be embodied by designing a cleaning compartment B with the appropriate number of intermediate rollers depending upon its size and varying the number and locations of ultrasonic vibrators.

The embodiment disclosed by the present invention can automatically introduce articles put on said infeed roller 3 into said carry-in compartment A, perform effective cleaning by means of ultrasonic vibrations acting rectangular to the articles while traveling in cleaning solution, and further provide consistent continuous operations including final water-finishing and drying in said compartments C and D, thus making great contributions to labor saving and high productivity. Moreover, the connection of existing apparatus is possible to the front or back of the embodiment.

We claim:

1. An ultrasonic cleaner wherein a processing cistern is divided into a carry-in compartment (A), a cleaning compartment (B), a water-wash finishing compartment (C), and a drying compartment (D), (1) said carry-in compartment (A) comprising an infeed roller (3), a pair of rubber rollers (4a and 4b) mounted vertically facing each other at a predetermined forward position of said infeed roller, and a cleaning solution sealing roller rotatable by the lower rubber roller of said pair, the contact surface between said pair of rubber rollers (4a and 4b) forming a carry-in port for washing in the horizontal direction and simultaneously forming a barrier for sealing in cleaning solution, said cleaning solution sealing roller (5) forming another sealing barrier with the surface of said lower roller (4b) at the side of said carry-in compartment (A), a horizontal plate (6) in said compartment (A), a resilient tongue (7) on said plate (6), said sealing roller (5) forming another sealing barrier by coming into pressure contact with said tongue (7) at the top of said horizontal plate (6), said plate being installed lower than said infeed roller (3) at the inlet side of said carry-in compartment (A), (2) said cleaning compartment (B) comprising a pair of rubber rollers (10a and 10b) mounted vertically facing each other at a predetermined forward position of said pair of rubber rollers (4a and 4b) in said compartment (A), a cleaning solution sealing roller (19) rotatable by the lower rubber roller (10b) of said pair, transfer rollers (11 and 12) positioned between said pairs of rubber rollers (4a, 4b and 10a, and 10b), conveying belts (14 and 15) positioned over said transfer rollers and a delivery roller (26) positioned rearward of said sealing solution roller (19), the contact surface of said pair of rubber rollers (10 a and 10b) forming a carry-out port for washings in the horizontal direction, said cleaning solution sealing roller (19) forming a barrier for cleaning solution sealing with the lower roller (10b) and roller (19) forming another sealing barrier by coming into pressure contact with a horizontal plate (21) disposed below said delivery roller (26), a resilient tongue (22) being disposed at the top of said horizontal plate (21) and positioned lower than said delivery roller (26) at the outlet side of said cleaning compartment (B), said conveying belts (14 and 15) being horizontally stretched and being rotatable at the same level as or lower than the contact faces between said rubber rollers (4a and 4b or 10a and 10b), ultrasonic vibrators (27a and 27b) disposed under said rotatable conveying belts (14 and 15), and a cleaning solution at a height sufficient to immerse said conveying belts (14 and 15) in said cleaning solution, and (3) said water-wash finishing compartment (C) comprising water pipes (29a and 29b) mounted above and below the work path at a predetermined fixed interval and opposingly faced, and a pair of vertically spaced squeezing rollers forward of said pipes and defining the work path therebetween on horizontal axes.

2. An ultrasonic cleaner claimed in claim 1 wherein said drying compartment (D) comprises a preparatory drying means so designed that hot air blast is injected through air injectors vertically opposite to each other and a finish drying means so designed that a wire-meshed conveyor circles a predetermined distance with an electric heater contained within said conveyor.

3. An ultrasonic cleaner claimed in claim 1 wherein said cleaning compartment (B) is provided with a water cock and an overflowing weir so that wash water is constantly kept at a certain level higher than said conveying belts, i.e., at the sufficient level to immerse articles in.

* * * * *